US011126382B2

(12) United States Patent
Wang et al.

(10) Patent No.: US 11,126,382 B2
(45) Date of Patent: Sep. 21, 2021

(54) SD CARD-BASED HIGH-SPEED DATA STORAGE METHOD

(71) Applicant: SHANDONG UNIVERSITY, Jinan (CN)

(72) Inventors: Yong Wang, Jinan (CN); Zhe Wang, Jinan (CN); Hongyu Li, Jinan (CN); Feng Zhou, Jinan (CN)

(73) Assignee: SHANDONG UNIVERSITY, Jinan (CN)

(*) Notice: Subject to any disclaimer, the term of this patent is extended or adjusted under 35 U.S.C. 154(b) by 179 days.

(21) Appl. No.: 15/772,496

(22) PCT Filed: Sep. 29, 2017

(86) PCT No.: PCT/CN2017/104199
§ 371 (c)(1),
(2) Date: Apr. 30, 2020

(87) PCT Pub. No.: WO2018/166179
PCT Pub. Date: Sep. 20, 2018

(65) Prior Publication Data
US 2020/0264811 A1 Aug. 20, 2020

(30) Foreign Application Priority Data

Mar. 16, 2017 (CN) .......................... 201710157667.6

(51) Int. Cl.
*G06F 3/06* (2006.01)
(52) U.S. Cl.
CPC ............ *G06F 3/0679* (2013.01); *G06F 3/064* (2013.01); *G06F 3/0613* (2013.01); *G06F 3/0632* (2013.01); *G06F 3/0656* (2013.01); *G06F 3/0659* (2013.01)

(58) Field of Classification Search
None
See application file for complete search history.

(56) References Cited

U.S. PATENT DOCUMENTS

| | | | | |
|---|---|---|---|---|
| 7,177,202 B2 * | 2/2007 | Chu | ...................... | G11C 7/1045 365/189.04 |
| 8,225,006 B1 * | 7/2012 | Karamcheti | ............ | G06F 11/20 710/5 |
| 8,566,508 B2 * | 10/2013 | Borchers | ............. | G06F 12/0246 711/103 |

(Continued)

*Primary Examiner* — Elias Mamo
(74) *Attorney, Agent, or Firm* — CBM Patent Consulting, LLC

(57) ABSTRACT

It discloses a technical solution of the present disclosure partitions a high-speed data code stream into a plurality of sequentially arranged data blocks so as to write the data blocks sequentially to a circular cache. The circular cache is comprised of N cache segments that share a write pointer, each cache segment owning an independent read pointer. The data blocks are sequentially written into the N cache segments; data will be continuously written to the $1^{st}$ cache segment; data will be read from the cache segment at a relatively low rate and written to a corresponding SD card, thereby implementing data speed reduction; a controller will integrate the disordered data into a same SD card following the original arrangement order, thereby completing all data storage work.

10 Claims, 4 Drawing Sheets

(56) References Cited

U.S. PATENT DOCUMENTS

| | | | |
|---|---|---|---|
| 8,689,042 B1 * | 4/2014 | Kanapathippillai | ........................ G06F 13/1657 714/6.22 |
| 2009/0132761 A1 * | 5/2009 | Yim | .................... G06F 12/0253 711/114 |
| 2015/0161000 A1 * | 6/2015 | Kim | ...................... G06F 3/0608 714/6.24 |

* cited by examiner

SD CARD-BASED HIGH-SPEED DATA STORAGE METHOD

FIELD

The present disclosure relates to the technical field of data storage, and more particularly relates to an SD card-based high-speed data storage method.

BACKGROUND

With rapid growth of informatization in the modern society, various mobile devices are becoming increasingly demanding on memory units in terms of their speeds and capacities. For example, in a navigation system, the data code stream of intermediate frequency (IF) signals of the $2^{nd}$ generation of Civil Beidou reaches 64 Mb/S, while the data code stream of IF signals of the $1^{st}$ generation of Civil Beidou reaches 200 Mb/S. Other devices for high-definition monitoring, high-definition digital camera shooting, high-speed communication and the like also require a high-speed data storage system to store acquired information. Although current common storage mediums such as solid-state drives (SSDs) have a relatively high storage speed, processing of the data in such hard disks has to be based on a computer system, while the computer system generally performs signal conversion, processing, and storage through a host computer and a hard disk, which apparently increases operational loads of the host computer and lacks portability. SD cards, as a new generation of low-cost memory devices based on a semi-conductor Flash memory, have been widely applied to mobile phones and digital cameras. Despite of their good portability and total reliance on a computer for their control system, the SD cards generally have a storage speed of under 50 Mb/s. Such a storage speed cannot satisfy the requirements of a high-speed data code stream system.

The Chinese patent CN202720628U discloses an SSD-based high-speed storage system. The high-speed storage system comprises a hard disk array, an SATA RAID controller, and an upper computer. The storage system expands its application scope by leveraging inherent physical properties and environment features of the SSDs and extends its storage capacity and speed by employing the SATA RAID control technology. The high-speed storage system may implement storage of high-speed code stream data in a better way. However, only for hardware facilities, it needs a hard disk, a controller, and an upper computer, etc., which results in a relatively high cost and a poor portability; therefore, it cannot well adapt new development demands of the existing technologies.

SUMMARY

To address the drawbacks in the prior art, the present disclosure provides an SD card-based high-speed data storage method.
Overview A storage method provided by the present disclosure intends to store a high-speed data code stream, wherein high-speed data is stored with a low-speed device using a circular cache through serial-parallel conversion (i.e., converting a route of high-speed serial data code stream into a plurality of routes of parallel data code streams), thereby implementing data speed reduction.

The technical solution of the present disclosure partitions a high-speed data code stream into a plurality of sequentially arranged data blocks so as to write the data blocks sequentially into a circular cache. The circular cache is comprised of N cache segments that share one write pointer, each cache segment having an independent read pointer. The data blocks are sequentially written to the N cache segments. When the $N^{th}$ cache segment is fully written with data, data will be continuously written to the $1^{st}$ cache segment. The cycle goes sequentially. After each cache segment is fully written, data will be read from the cache segment at a relatively low rate and written to a corresponding SD card, thereby implementing data speed reduction. After the data acquisition work is done, a controller will integrate the disordered data into a same SD card following the initial arrangement order, thereby completing all data storage work.

Introduction of Terms

FIFO: an abbreviation of First Input First Output, which is a traditional sequential execution method, where the instruction inputted first is first completed and exited, and then the second instruction will be executed.

A Technical Solution of the Present Disclosure is Provided Below

An SD card-based high-speed data storage method, comprising steps of:

1) partitioning a high-speed serial signal into N data blocks of 8 bits×512, writing the N data blocks correspondingly to N cache segments, wherein the N cache segments are circularly arranged with head-tail connected, each cache segment having a width of 8 bits and a depth of 512;

2) reading data in the circular cache segments, and writing the data in the N cache segments to corresponding N SD cards, respectively, thereby completing data speed reduction;

3) reading the data in the N SD cards, respectively, specific procedures of which include: sequentially reading data in a first BLOCK in the first SD card, data in a first BLOCK in the second SD card, . . . , and data in the first BLOCK in the $N^{th}$ SD card; then, undergoing a next reading cycle to sequentially read data in the second BLOCK in the first SD card, data in the second BLOCK in the 2nd SD card, . . . , and data in the second BLOCK in the $N^{th}$ SD card, so on and so forth; reading out the data according to their arrangement order in the high-speed serial signal through the operations above, and storing them into a general SD card, thereby completing integrated storage of the data. During the data storage process, the data are stored to N SD cards, respectively. To facilitate data processing and application later, these data are integrated together according to their original arrangement order.

In a preferred embodiment of the present disclosure, in the step 1), operation procedures on the SD cards during writing the data in the N cache segments to the corresponding N SD cards include: initialization and write operation:

A. Initialization:

A1. Setting a power-up time delay of the SD cards to at least 74 clocks, wherein power up requires an enough long delay time for the SD cards to prepare, and different delay time is set for different cards;

A2. Pulling low a chip signal CS to select an SD card; the chip signal refers to a signal of a $22^{nd}$ pin in a BIOS chip where an address line and a data line are separated in a motherboard with a traditional south-north bridge architecture. The signal is emitted from the CPU, passes through the north bridge, and arrives at the south bridge. Presence/ absence of the signal may be a basis for preliminarily determining whether the south bridge, the north bridge, and the CPU have started working, and whether BIOS data have been corrupted.

A3. Sending a CMD0 command, wherein the SD card enters an Idle state after returning 0x01;

A4. First sending a CMD8 command to the SD card; wherein if the CMD8 returns No Error, it is preliminarily determined that the SD card is an SD 2.0 card; cyclically sending CMD55+ACMD41 till returning the 0x00, determining that the SD 2.0 card is successfully initiated, and entering a Ready state; further sending a CMD 58 command to determine whether the SD card is an HCSD or an SCSD;

To distinguish whether the SD card version is SD 2.0 or SD 1.0 or an MMC card, considering that the protocol is upward compatible, first the command CMD 8 only supported by the SD 2.0 is sent; if CMD 8 returns No Error, the card is SD 2.0 card.

A5. Sending the CMD 8 command to the SD card, and cyclically sending CMD55+ACMD41 if it returns Error; wherein if no Error is returned after cyclically sending the CMD55+ACMD41 for a times, it is determined that the SD card is an SD 1.0 card; now, the SD 1.0 card is successfully initiated;

If an Error is returned after cyclically sending the CMD55+ACMD 41 for a times, the CMD 1 is further sent to perform initialization; if the CMD1 returns No Error, it is determined that the SD card is an MMC card; if the CMD1 returns Error, the SD card cannot be identified;

A6. Pulling high the chip signal CS and exiting the initialization operation;

B. Write Operation:

B1. Sending a CMD 24 or CMD 25 command, and returning 0x00;

B2. Sending a data start token 0xfe, formal data 512 Bytes, and CRC check 2 Bytes; wherein a default data length to start transmission is 512 Bytes, the length of the data block being set through CMD 16;

In step 3), in the step of reading the data in N SD cards respectively, operation procedures on the SD card include a read operation:

C. read operation:

C1. Sending a CMD 17 or CMD 18 read command, and returning 0x00;

C2: receiving the data start token 0xfe or 0xfc, formal data 512 Bytes, and CRC check 2 Bytes. The read operation refers to, with the N SD cards to store data surrounding a general card for one circle, reading data from the N SD cards sequentially along a clockwise direction.

The read operation corresponds to a reverse operation of the write operation, but the read operation will have no speed limit. Finally, data arranged according to the initial arrangement order is obtained from the general SD card, thereby completing the whole data acquisition process.

Further, preferably, the times a of cyclically sending the CMD55+ACMD 41 in step A5 is 3~90.

In a preferred embodiment of the present disclosure, in the step 1), a pointer for writing the N data blocks correspondingly to the N cache segments is a write pointer, the write pointer being unique; in the step 2), a pointer used in reading the data in the cache segments is a read pointer, there being N pointers; the N cache segments are alternately subjected to the data block write operation, where only one cache segment is subjected to the data block write operation at one time, and the write pointer cyclically writes the data blocks to the N cache segments, wherein after 512×8 bit data are written to each cache segment, the read pointer starts reading the data in the cache segment; the process of reading the data in the cache segments are simultaneously performed in the N cache segments. The write pointer non-intermittently writes data to the circular cache during working of the system; the number of the read pointers is determined based on the storage speed and storage capacity of the system; the N read pointers may realize N multiples of speed reduction. As long as a cache segment is fully written with 512×8 bit data, the data may be read and stored to an SD card, without a need of waiting for subsequent cache segments to be fully written with the 512×8 bit data. For example, when the first cache segment is fully written with 512×8 bit data, writing data to the second cache segment starts; meanwhile, the data in the first cache segment starts to be read and stored to the SD card.

Further, preferably, a ratio between a clock speed of writing the N data blocks correspondingly to the N cache segments and a clock speed of reading the data in the cache segments is N:1. To match the speeds of reading and writing data, the clocks of reading and writing data is set to N:1.

In a preferred embodiment of the present disclosure, before the step 1), there further comprises a step of integrating input signals into 8-bit high-speed serial signals. Through this step, common input signals are integrated into a group of 8-bit high-speed serial digital signals. The data in the SD cards are stored in the form of BLOCK (512×8 bits). If the input signals are 4-bit high-speed signals, for the convenience of storage, the 4-bit input signals are first integrated into 8-bit serial signals, thereby obtaining a group of 8-bit high-speed serial digital signals.

In a preferred embodiment of the present disclosure, the SD cards and the general SD card are all SDHC cards. Supposing that the frequency of the intermediate frequency signal in a navigation is 200 Mb/s, the time length of acquiring data is 5 min, then 200 Mb/s×5 min, which substantially needs a 6G storage space; the SDHC card may satisfy the storage requirement of this scheme.

In a preferred embodiment of the present disclosure, 4-bit SDs are selected to implement the data storage process in the step of writing the data in the N cache segments to the corresponding N SD cards. There are two modes of reading and writing the SD cards: SD mode and SPI mode. Particularly, the SD mode is further differentiated into a 1-bit transmission mode and a 4-bit transmission mode. The SD cards use a private SD mode in default.

In a preferred embodiment of the present disclosure, the SD card-based high-speed data storage method according to the present disclosure is implemented based on an FPGA. The FPGA (Field Programmable Gate Array) performs processing of control signals by completing a circuit design with a hardware description language (Verilog or VHDL); it functions like a single-chip machine, an ARM, etc., featuring mainly parallel operation.

In a further preferred embodiment, in the step 2), a specific method of reading the data in the circular cache segments and writing the data in the N cache segments to corresponding N SD cards comprises: strapping data read ports of the N cache segments to the data input ports of N SD card controllers, respectively; writing the data in the N cache segments to the corresponding N SD cards; the SD card controllers are implemented through the FPGA. The SD card controllers correspond to a card reader when reading SD cards with a computer.

In a preferred embodiment of the present disclosure, the high-speed serial signal in the step 1) refers to a serial signal with a data rate greater than 300 Mb/s.

In a preferred embodiment of the present disclosure, N≥3. The number N is determined by the storage speed. The write speed of the SD cards is about 50 Mb/s; to store a signal with a data rate of 300 Mb/s, N is at least 6; to store a signal with a data rate of 500 Mb/s, N is at least 10.

In a preferred embodiment of the present disclosure, the cache segment is FIFO.

To facilitate data operation and processing later on a PC, corresponding file system data need to be written to the SD, i.e., writing, in a form of FAT table, information including the amount of the data to be stored, an initial position of data storage, and a filename to the SD card with write commands. The commands used by the file system are identical to the commands used by the write file data, i.e., first writing a file root directory content using a single block write command, and then writing the file FAT content using continuous block write commands. Before writing the root directory content, it is needed to compute the size of the file and write the file size and an initial cluster number of the file to the root directory attributes.

The present disclosure has the following advantageous effects:

1. The SD card-based high-speed data storage method according to the present disclosure expands a plurality of SD cards into a virtual super memory card, realizes superimposition of storage speeds and storage capacities of the plurality of SD cards, and enables low speed memory devices to store high-speed code streams; it improves the portability and flexibility of the memory system with a lower cost;

2. The SD card-based high-speed data storage method improves the data storage speed with increase of the number of SD cards; moreover, with a good anti-vibration performance and portability; it may be applied outdoors.

DETAILED DESCRIPTION OF EMBODIMENTS

Hereinafter, the present disclosure will be described in further detail through embodiments with reference to the accompanying drawings; however, the present disclosure is not limited to these embodiments.

Embodiment 1

Figure 1:
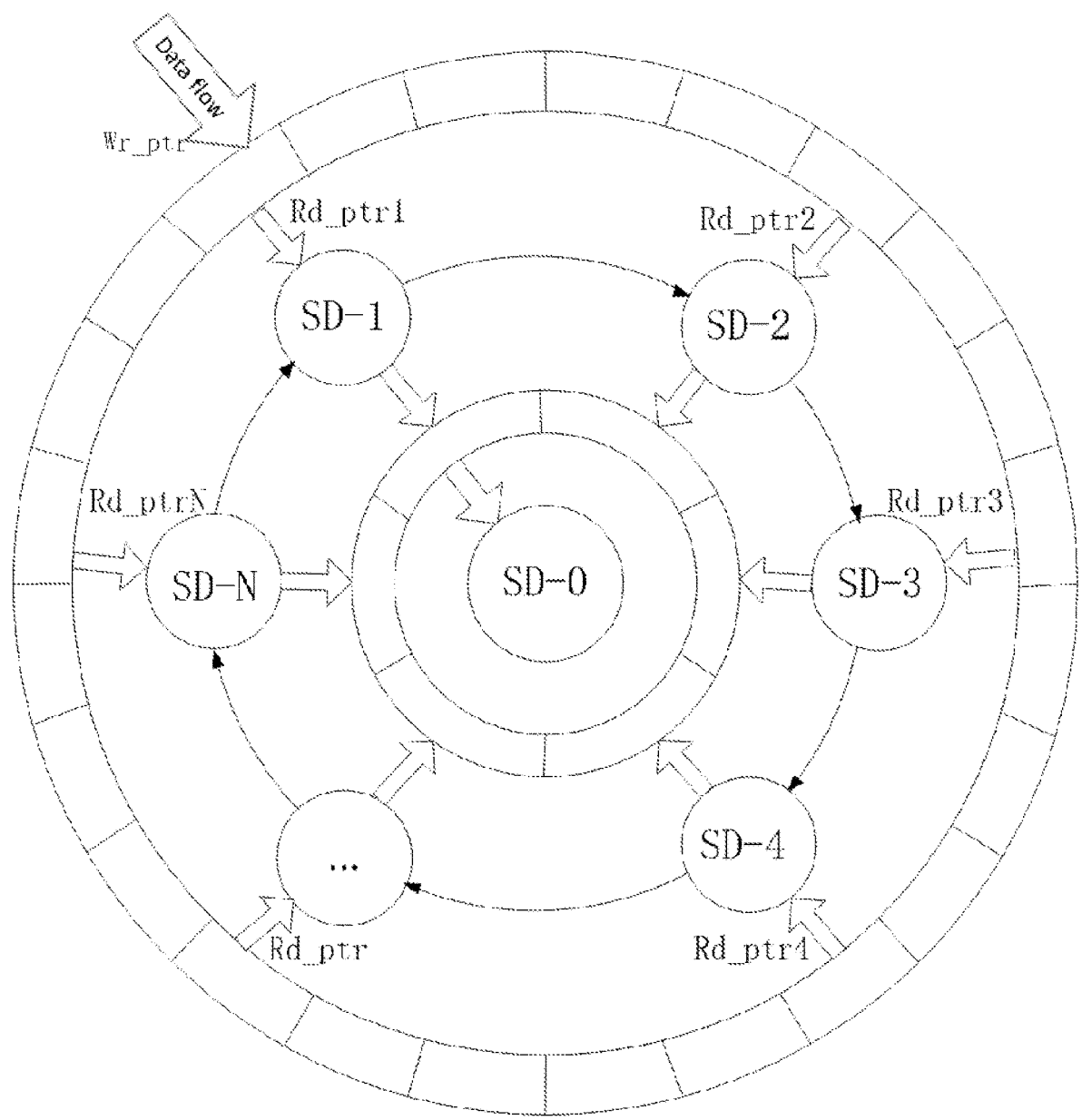
FIG. 1 illustrates an overall framework schematic diagram of SD cards and a general SD card according to the present disclosure.
Figure 2:
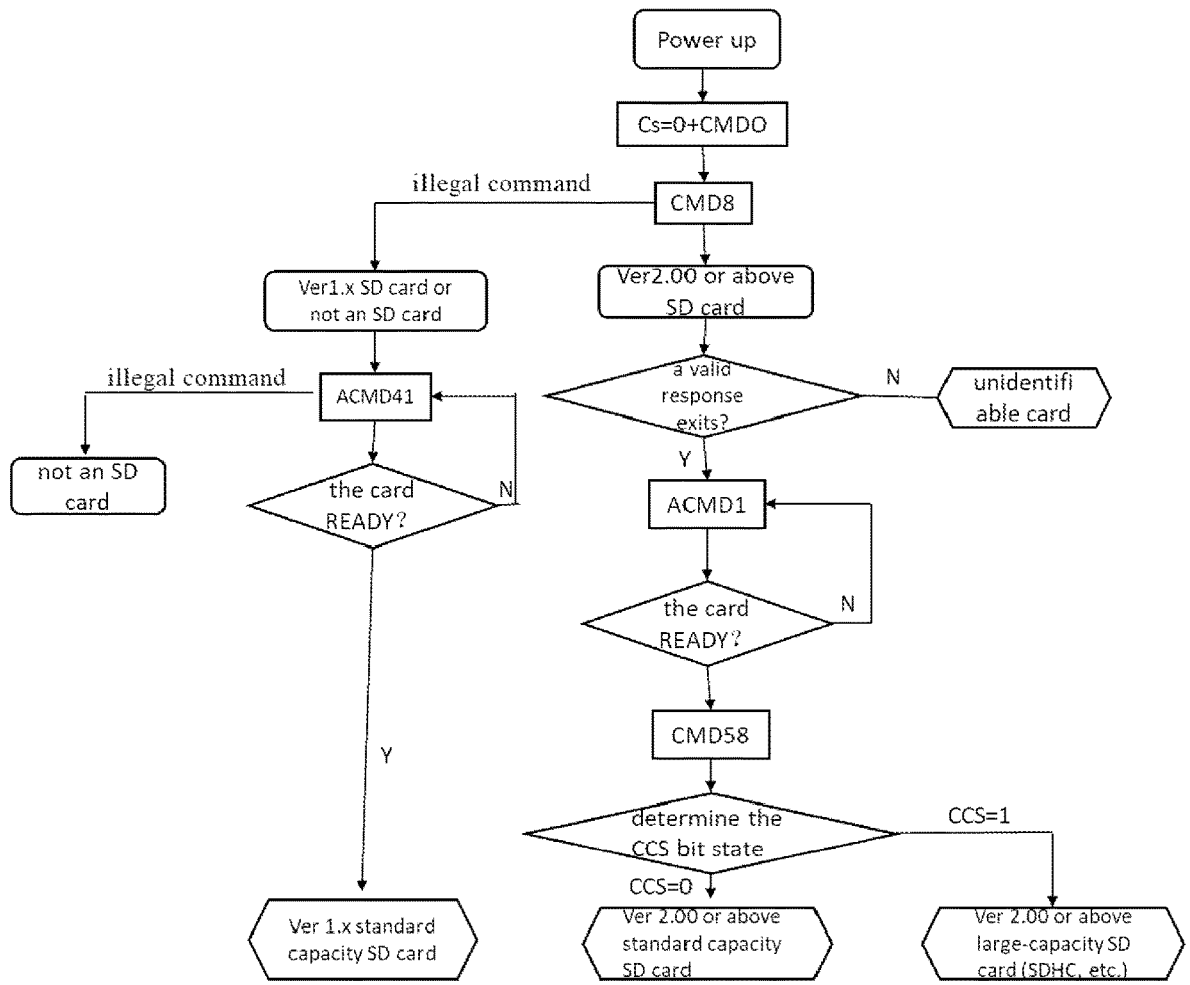
FIG. 2 illustrates an initialization process of the SD card according to the present disclosure.
Figure 3:
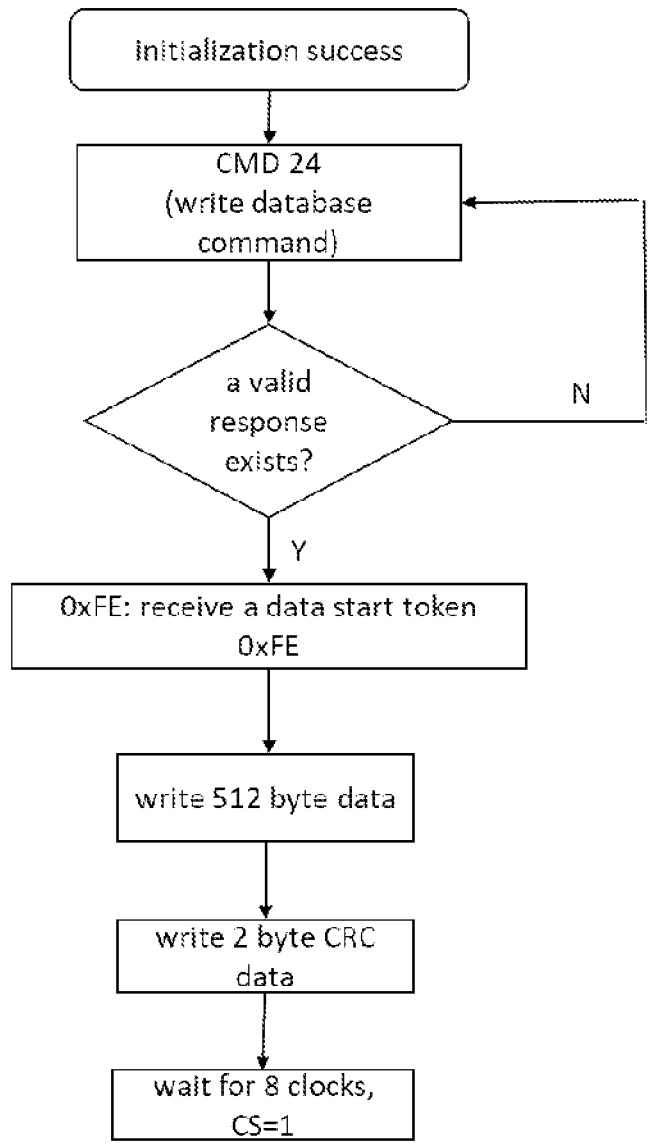
FIG. 3 illustrates a write operation flow diagram of the SD card according to the present disclosure.
Figure 4:
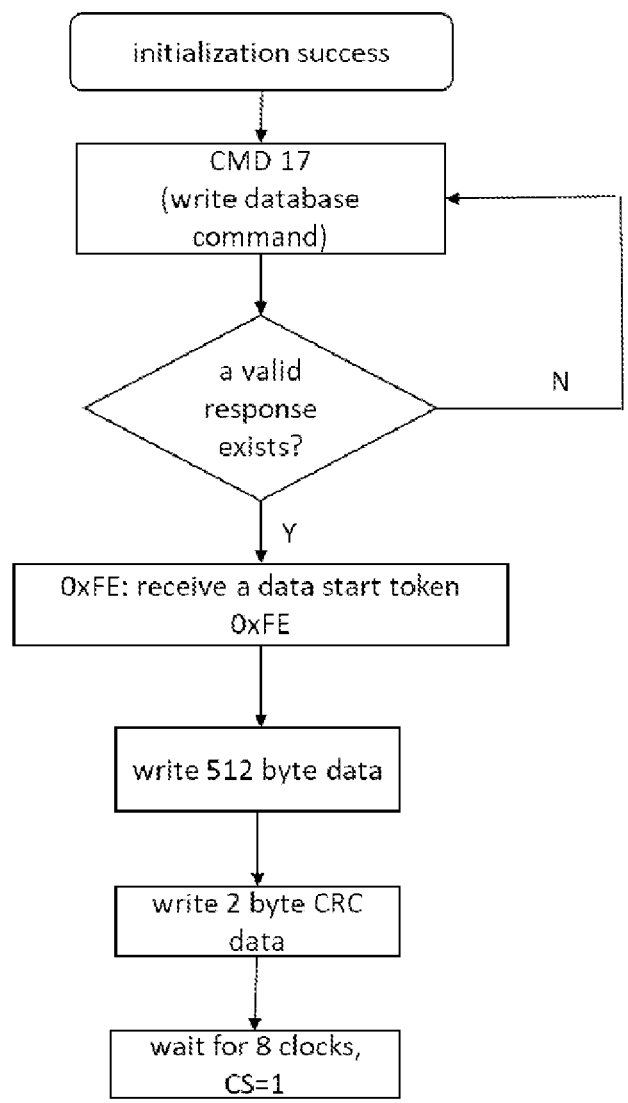
FIG. 4 illustrates a read operation flow diagram of the SD card according to the present disclosure.

As shown in FIGS. 1-4, an SD card-based high-speed data storage method configured for storing a route of 300 Mb/s code stream, comprising steps of:

1) partitioning a high-speed serial signal into N data blocks of 8 bit×512, writing the N data blocks correspondingly to N cache segments, wherein the N cache segments are circularly arranged with head-tail connected, each cache segment having a width of 8 bits and a depth of 512, where N=6

2) reading data in the circular cache segments, and writing the data in the N cache segments to corresponding N SD cards, respectively, thereby completing data speed reduction;

3) reading the data in the N SD cards, respectively, specific procedures of which include: sequentially reading data in a first BLOCK in the first SD card, data in a first BLOCK in the second SD card, . . . , and data in a first BLOCK in the $N^{th}$ SD card; then, undergoing a next reading cycle to sequentially read data in the second BLOCK in the first SD card, data in the second BLOCK in the 2nd SD card, . . . , and data in the second BLOCK in the $N^{th}$ SD card, so on and so forth; reading out the data according to their arrangement orders in the high-speed serial signal through the operations above, and storing them into a general SD card, thereby completing integrated storage of the data. During the data storage process, the data are stored into N SD cards, respectively. To facilitate data processing and application later, these data are integrated together according to their original arrangement order.

By converting the 300 Mb/s data code stream into 6 routes of parallel 50 Mb/s code streams (the write speed of current SD cards may reach 50 Mb/s), a low-speed device is enabled to store high-speed data.

Embodiment 2

A route of 200 Mb/s data code stream is stored in a similar manner like the SD card-based high-speed data storage method according to embodiment 1, except that N=4.

Embodiment 3

This embodiment is similar to Embodiment 1 of the SD card-based high-speed data storage method except that: in the step 1), operation procedures on the SD card during writing the data in the N cache segments to the corresponding N SD cards include: initialization and write operation:

A. Initialization:

A1. Setting a power-up time delay of the SD cards to 80 clock;

A2. Pulling low a chip signal CS to select an SD card;

A3. Sending a CMD0 command, wherein the SD card enters an Idle state after returning 0x01;

A4. First sending a CMD8 command to the SD card; wherein if the CMD8 returns No Error, it is preliminarily determined that the SD card is an SD 2.0 card; cyclically sending CMD55+ACMD41 till returning the 0x00, and then determining that the SD 2.0 card is successfully initiated, and entering a Ready state; further sending a CMD 58 command to determine whether the SD card is a HCSD or an SCSD;

To distinguish whether the SD card version is SD 2.0 or SD 1.0 or an MMC card, considering that the protocol is upward compatible, first the command CMD 8 only supported by the SD 2.0 is sent; if CMD 8 returns No Error, the card is SD 2.0 card.

A5. Sending the CMD 8 command to the SD card, and cyclically sending CMD55+ACMD41 if it returns Error; wherein if no Error is returned after cyclically sending the CMD55+ACMD 41 for a times, it is determined that the SD card is an SD 1.0 card; now, the SD 1.0 card is successfully initiated; where a=20;

If an Error is returned after cyclically sending the CMD 55+ACMD 41 for a times, the CMD 1 is further sent to perform initialization; if the CMD1 returns No Error, it is determined that the SD card is an MMC card; if the CMD 1 returns Error, the SD card cannot be identified A6. Pulling high the chip signal CS and exiting the initialization operation;

B. Write Operation:

B1. Sending a CMD 24 command, and returning 0x00;

B2. Sending a data start token 0xfe, formal data 512 Bytes, and CRC check 2 Bytes; wherein a default data length to start transmission is 512 Bytes, the length of a data block being set through CMD 16;

In step 3), in the step of reading the data in N SD cards respectively, operation procedures on the SD card include a read operation:

C. read operation:

C1. Sending a CMD 17 read command, and returning 0x00;

C2: receiving the data start token 0xfe or 0xfc, formal data 512 Bytes, and CRC check 2 Bytes. The read operation refers to, with the N SD cards to store data surrounding a general card for one circle, reading data from the N SD cards sequentially along a clockwise direction. The read operation corresponds to a reverse operation of the write operation, but the read operation will have no speed limit. Finally, data arranged according to the initial arrangement order is obtained from the general SD card, thereby completing the whole data acquisition process.

Embodiment 4

This embodiment is similar to Embodiment 3 of the SD card-based high-speed data storage method except that: what is sent in the step B1 is the CMD 25 command; what is sent in the step C1 is CMD 18 read command.

Embodiment 5

This embodiment is similar to Embodiment 1 of the SD card-based high-speed data storage method except that: in the step 1), a pointer for writing the N data blocks correspondingly to the N cache segments is a write pointer, the write pointer being unique; in the step 2), a pointer used in reading the data in the cache segments is a read pointer, there being N pointers; the N cache segments are alternately subjected to the data block write operation, where only one cache segment is subjected to the data block write operation at one time, and the write pointer cyclically writes the data blocks to the N cache segments, wherein after 512×8 bit data are written to each cache segment, the read pointer starts reading the data in the cache segment; the process of reading the data in the cache segments are simultaneously performed in the N cache segments. The write pointer non-intermittently writes data in the circular cache during working of the system; the number of the read pointers is determined based on the storage speed and storage capacity of the system; the N read pointers may realize N multiples of speed reduction. As long as a cache segment is fully written with 512×8 bit data, the data may be read and stored to an SD card, without a need of waiting for subsequent cache segments to be fully written with the 512×8 bit data. For example, when the first cache segment is fully written with 512×8 bit data, writing data to the second cache segment starts; meanwhile, the data in the first cache segment starts to be read and stored to the SD card.

The write pointer non-intermittently writes data to the circular cache during working of the system; the number of the read pointers is determined based on the storage speed and storage capacity of the system; the N read pointers may realize N multiples of speed reduction. As long as the cache segment is fully written with 512×8 bit data, the data may be read and stored to the SD card, without a need of writing for subsequent cache segments to be fully written with the 512×8 bit data.

Embodiment 6

This embodiment is similar to Embodiment 5 of the SD card-based high-speed data storage method except that: a ratio between a clock speed of writing the N data blocks correspondingly to the N cache segments and a clock speed of reading the data in the cache segments is N:1. To match the speeds of reading and writing data, the clocks of reading and writing data is set to N:1.

Embodiment 7

This embodiment is similar to Embodiment 1 of the SD card-based high-speed data storage method except that: before the step 1), there further comprises a step of integrating input signals into 8-bit high-speed serial signals. Through this step, common input signals are integrated into a group of 8-bit high-speed serial digital signals. The data in the SD cards are stored in the form of BLOCK (512×8 bits). If the input signals are 4-bit high-speed signals, for the convenience of storage, the 4-bit input signals are first integrated into 8-bit serial signals, thereby obtaining a group of 8-bit high-speed serial digital signals.

Embodiment 8

This embodiment is similar to Embodiment 1 of the SD card-based high-speed data storage method except that: the SD cards and the general SD card are all SDHC cards. Supposing that the frequency of the intermediate frequency signal in a navigation is 200 Mb/s, the time length of acquiring data is 5 min, then 200 Mb/s×5 min, which substantially needs a 6G storage space; the SDHC card may satisfy the storage requirement of this scheme.

Embodiment 9

This embodiment is similar to Embodiment 1 of the SD card-based high-speed data storage method except that: a 4 bit-SD is selected to implement a data storage procedure in the step of writing the data in the N cache segments to the corresponding N SD cards.

Embodiment 10

This embodiment is similar to Embodiment 1 of the SD card-based high-speed data storage method except that: the SD card-based high-speed data storage method according to the present disclosure is implemented based on the FPGA.

Embodiment 11

This embodiment is similar to Embodiment 10 of the SD card-based high-speed data storage method except that: in the step 2), a specific method of reading the data in the circular cache segments and writing the data in the N cache segments to corresponding N SD cards comprises: strapping data read ports of the N cache segments to the data input ports of N SD card controllers, respectively; writing the data in the N cache segments to the corresponding N SD cards; the SD card controllers are implemented through the FPGA.

The SD card controllers correspond to a card reader when reading SD cards with a computer.

Embodiment 12

This embodiment is similar to Embodiment 10 of the SD card-based high-speed data storage method except that: the high-speed serial signal in the step 1) refers to a serial signal with a data rate greater than 300 Mb/s.

Embodiment 13

This embodiment is similar to Embodiment 10 of the SD card-based high-speed data storage method except that: the cache segment is FIFO.

It is verified through testing in embodiments 1~13, when 4 SD cards are adopted, the data acquisition rate of the data acquisition system may reach 200 Mb/s; when 6 SD cards are adopted, the data acquisition rate of the data acquisition system may reach 300 Mb/s. When performing data acquisition by a traditional solution of using SD cards, the maximum data acquisition rate is only 50 Mb/s. It is seen that the SD card-based high-speed data storage method greatly improves the data storage rate, which may well satisfy the storage requirements of high-speed data code stream.

What is claimed is:

1. An SD card-based high-speed data storage method, comprising steps of:
   1) partitioning a high-speed serial signal into N data blocks of 8 bit×512, writing the N data blocks correspondingly to N cache segments, wherein the N cache segments are circularly arranged with head-tail connected, each cache segment having a width of 8 bits and a depth of 512;
   2) reading data in the circular cache segments, and writing the data in the N cache segments to corresponding N SD cards, respectively, thereby completing data speed reduction;
   3) reading the data in the N SD cards, respectively, specific procedures of which include: sequentially reading data in a first BLOCK in the first SD card, data in a first BLOCK in the second SD card, . . . , and data in a first BLOCK in the $N^{th}$ SD card; then, undergoing a next reading cycle to sequentially read data in the second BLOCK in the first SD card, data in the second BLOCK in the 2nd SD card, . . . , and data in the second BLOCK in the $N^{th}$ SD card, so on and so forth; reading out the data according to their arrangement orders in the high-speed serial signal through the operations above, and storing them into a general SD card, thereby completing integrated storage of the data.

2. The SD card-based high-speed data storage method according to claim 1, characterized in that: in the step 1), operation procedures on the SD card during writing the data in the N cache segments to the corresponding N SD cards include: initialization and write operation:
   A. initialization:
   A1. setting a power-up time delay of the SD cards to at least 74 clocks;
   A2. pulling low a chip signal CS to select an SD card;
   A3. sending a CMD0 command, wherein the SD card enters an Idle state after returning 0x01;
   A4. first sending a CMD8 command to the SD card; wherein if the CMD8 returns No Error, it is preliminarily determined that the SD card is an SD 2.0 card; cyclically sending CMD55+ACMD41 till returning the 0x00, determining that the SD 2.0 card is successfully initiated, and then entering a Ready state; further sending a CMD 58 command to determine whether the SD card is a HCSD or an SCSD;
   A5. sending the CMD 8 command to the SD card, and cyclically sending CMD55+ACMD41 if it returns Error; wherein if no Error is returned after cyclically sending the CMD55+ACMD41 for a times, it is determined that the SD card is an SD 1.0 card; now, the SD 1.0 card is successfully initiated; wherein
   if an Error is returned after cyclically sending the CMD55+ACMD 41 for a times, the CMD 1 is further sent to perform initialization; if the CMD1 returns No Error, it is determined that the SD card is an MMC card; if the CMD1 returns Error, the SD card cannot be identified;
   A6. pulling high the chip signal CS and exiting the initialization operation;
   B. write Operation:
   B1. sending a CMD 24 or CMD 25 command, and returning 0x00;
   B2. sending a data start token 0xfe, formal data 512 Bytes, and CRC check 2 Bytes;
   wherein a default data length to start transmission is 512 Bytes, the length of a data block being set through CMD 16; wherein
   in step 3), in the step of reading the data in N SD cards respectively, operation procedures on the SD card include a read operation:
   C. read operation:
   C1. sending a CMD 17 or CMD 18 command, and returning 0x00;
   C2: receiving the data start token 0xfe or 0xfc, formal data 512 Bytes, and CRC check 2 Bytes.

3. The SD card-based high-speed data storage method according to claim 1, characterized in that in the step 1), a pointer for writing the N data blocks correspondingly to the N cache segments is a write pointer, the write pointer being unique; in the step 2), a pointer used in reading the data in the cache segments is a read pointer, there being N pointers; the N cache segments are alternately subjected to the data block write operation, where only one cache segment is subjected to the data block write operation at one time, and the write pointer cyclically writes the data blocks to the N cache segments, wherein after 512×8 bit data are written to each cache segment, the read pointer starts reading the data in the cache segment; the process of reading the data in the cache segments are simultaneously performed in the N cache segments.

4. The SD card-based high-speed data storage method according to claim 3, characterized in that a ratio between a clock speed of writing the N data blocks correspondingly to the N cache segments and a clock speed of reading the data in the cache segments is N:1.

5. The SD card-based high-speed data storage method according to claim 1, further comprising before the step 1), there further comprises a step of integrating input signals into 8-bit high-speed serial signals.

6. The SD card-based high-speed data storage method according to claim 1, characterized in that the SD cards and the general SD card are all SDHC cards.

7. The SD card-based high-speed data storage method according to claim 1, characterized in that 4-bit SDs are selected to implement the data storage process in the step of writing the data in the N cache segments to the corresponding N SD cards.

8. The SD card-based high-speed data storage method according to claim 1, characterized in that the SD card-based high-speed data storage method according to the present disclosure is implemented based on an FPGA.

9. The SD card-based high-speed data storage method according to claim 1, characterized in that: in the step 2), a specific method of reading the data in the circular cache segments and writing the data in the N cache segments to corresponding N SD cards comprises: strapping data read ports of the N cache segments to the data input ports of N SD card controllers, respectively; writing the data in the N cache segments to the corresponding N SD cards; the SD card controllers are implemented through the FPGA.

10. The SD card-based high-speed data storage method according to claim 1, characterized in that the cache segment is FIFO.

* * * * *